(12) United States Patent
Kahlman et al.

(10) Patent No.: US 6,700,509 B1
(45) Date of Patent: Mar. 2, 2004

(54) DEVICE AND METHOD FOR PROCESSING A DIGITAL INFORMATION SIGNAL

(75) Inventors: Josephus Arnoldus Henricus Maria Kahlman, Eindhoven (NL); Willem Marie Julia Marcel Coene, Eindhoven (NL)

(73) Assignee: Koninklijke Philips Electronics N.V., Eindhoven (NL)

( * ) Notice: Subject to any disclaimer, the term of this patent is extended or adjusted under 35 U.S.C. 154(b) by 0 days.

(21) Appl. No.: 09/702,347

(22) Filed: Oct. 31, 2000

(30) Foreign Application Priority Data

Nov. 12, 1999 (EP) .............................. 99203792

(51) Int. Cl.⁷ ................................ H03M 7/00
(52) U.S. Cl. .................... 341/59; 341/56; 341/57; 341/58; 341/95; 375/295; 375/246
(58) Field of Search ................. 341/58, 59, 56, 341/57, 95; 375/295, 246, 264, 368, 232

(56) References Cited

U.S. PATENT DOCUMENTS

| | | | | |
|---|---|---|---|---|
| 4,413,340 A | | 11/1983 | Odaka et al. ............... 371/39 |
| 4,641,128 A | * | 2/1987 | Schouhamer Immink .... 341/67 |
| 4,728,929 A | * | 3/1988 | Tanaka ........................ 341/73 |
| 5,095,484 A | * | 3/1992 | Karabed et al. ............. 341/58 |
| 5,142,421 A | * | 8/1992 | Kahlman et al. ............. 341/59 |
| 5,396,239 A | * | 3/1995 | McMahon et al. ............ 341/59 |
| 5,469,462 A | * | 11/1995 | Kahlman et al. ............ 375/232 |
| 5,477,222 A | * | 12/1995 | Kahlman et al. ............. 341/95 |
| 5,477,722 A | | 12/1995 | Kahlman et al. ............. 341/95 |
| 5,696,505 A | * | 12/1997 | Schouhamer Immink .... 341/59 |
| 5,760,718 A | * | 6/1998 | Schouhamer Immink .... 341/80 |
| 5,781,130 A | * | 7/1998 | McLaughlin et al. ......... 341/59 |
| 5,943,368 A | * | 8/1999 | Bergmans et al. ............ 341/59 |
| 6,157,325 A | * | 12/2000 | Kahlman et al. ............. 341/59 |
| 6,225,921 B1 | * | 5/2001 | Kahlman et al. ............. 341/59 |

FOREIGN PATENT DOCUMENTS

WO  WO9959251  11/1999  ............ H03M/7/48

* cited by examiner

Primary Examiner—Michael J. Tokar
Assistant Examiner—Lam T. Mai
(74) Attorney, Agent, or Firm—Michael E. Belk

(57) ABSTRACT

A device and associated method for processing a digital information signal from a channel signal. The digital information signal is runlength limited with one or more constraints. The device comprises receiving means for receiving the channel signal and means for comparing a detected runlength with a predetermined value indicative of a minimum runlength constraint or a maximum runlength constraint of the channel signal and for generating a control signal when the detected runlength violates said constraint. The device further comprises substitute means for in response to the control signal deleting or inserting an element in the channel signal.

24 Claims, 4 Drawing Sheets

DEVICE AND METHOD FOR PROCESSING A DIGITAL INFORMATION SIGNAL

CROSS REFERENCE TO RELATED APPLICATIONS

This is a continuation of application Ser. No. 09/307,978 hereby incorporated in whole by reference now patented 6,157,324 issued on Dec. 5, 2000.

BACKGROUND OF THE INVENTION

1. Technical Field

The invention relates to a device for reproducing a digital information signal from a channel signal, the digital information signal being runlength limited with one or more constraints, comprising receiving means for receiving the channel signal.

The invention also relates to a method for reproducing a digital information signal from the channel signal.

2. Related Art

The invention is in the field of channel coding, in particular in runlength limited channel coding. As known, usually the length of time, expressed in channel bits, between consecutive transitions is called the runlength. A (d,k) sequence is characterised by two parameters, a d-constraint and a k-constraint. Hence, this (d,k) sequence satisfies the following two conditions: due to the d-constraint, two logical "ones" are separated by a run of at least d consecutive "zeros"; due to the k-constraint two logical "ones" are separated by a run of at most k consecutive "zeros". The (d,k) sequence is converted (from the (d,k) domain) into a runlength-limited (RLL) sequence of the type (d,k) (in the RLL domain) upon precoding in a 1T precoder. This RLL sequence comprises elements with runlengths (either an array of consecutive zeroes or an array of consecutive ones) of d+1 at minimum and k+1 at maximum between subsequent signal reversals in the information signal. The values of (d+1) and (k+1) indicate the minimum and maximum runlengths of the element allowed in the sequence. It must be noted that in stead of the term "an element with a runlength" the term "a runlength" is used. It must also be noted that the term element can be used to indicate both an element of a (d,k) sequence and an element of an RLL sequence. An element is considered to be extending over a runlength in the RLL domain or (d,k) domain.

In European Patent Application No. 98201515.8 (PHN 16.906), a non-prepublished patent application, an device being capable of generating a digital information signal, the digital information signal being runlength limited with a (d+n)-constraint and a (k+n)-constraint is described.

SUMMARY OF THE INVENTION

In this patent application, a device is described that converts an encoded channel signal with a d-constraint equal to 2 into another channel signal that has a d-constraint equal to 1. This conversion can be carried out in the (d,k) domain or in the RLL domain. As a result, all runlengths will be shortened by one bitcell, resulting in a converted channel encoded signal. Upon channel decoding, the runlengths can be enlarged by adding one bitcell, resulting in a replica of the original signal. If this device is reading out an information carrier and misses one element with a certain runlength the following problem occurs. When deconverting the digital information signal with a d-constraint equal to 1, into a digital information signal with a d-constraint equal to 2, for each missed element (e.g. while reading out an information carrier comprising the digital information signal) two bits should have been inserted into the d=1 constrained channel signal as each element results in two transitions. In other words, missing one element with a certain runlength results in two missing transitions (resulting in a bitslip) in the channel code, which error can not be easily overcome with standard Read-Solomon error-correction measures, like CIRC, the error-correction process used in the Digital Audio Compact Disc. The bitslip errors consequently results in errors up to the next sync word in the signal.

The invention has for its object to provide a device for reproducing a digital information signal, which mitigates the effect of errors present in a channel signal received by the device.

The device in accordance with the invention is characterised in that the device further comprises means for comparing a detected runlength with a predetermined value indicative of a minimum runlength constraint or a maximum runlength constraint of the channel signal and for generating a control signal when the detected runlength violates said constraint and substitute means for in response to the control signal deleting or inserting an element in the channel signal.

The invention is based on the recognition that the runlength of an element of the channel signal can indicate that during reproduction at least one element with a certain runlength has not been detected or that an extra element has been inserted. By comparing the runlength of the channel signal with a value indicative of a k-constraint of this signal, an element of the runlength limited digital information signal can be replaced with another element. In this way the missing runlength can be inserted into the information signal. Doing so, the number of transitions in the signal is reconstructed correctly. This has as a result that, when converting the signal by changing the runlengths by n bitcells, the correct number of bits are inserted or deleted and no bitslip errors occur. Similarly, by comparing the runlength of the channel signal with a value indicative of a d-constraint of this signal an element of the runlength limited digital information signal can be replaced with another element. In this way an extra inserted runlength can be removed from the information signal. This extra insertion can for example occur when a large runlength is detected in a noisy channel, causing the detection of small runlengths. E.g. in a channel signal with a d-constraint of 3 an 17 runlength can erroneously be detected as the runlengths I2-I3-I2.

Another device according to the invention is characterised in that the predetermined value is larger than the maximum runlength in the channel signal.

The presence in the signal of an element with a runlength with a predetermined value which is larger than the maximum runlength in the correctly detected channel signal is an indication that the reproduced information signal contains errors. These errors can be caused by a so-called transition-shift but also by a missing runlength. This device therefore has as an advantage that a substitution of part of the reproduced digital information signal only occurs if a relatively large violation is present in the reproduced signal. If a substitution would take place on each violation, an unjust substitution could take place, e.g. in case a small k-violation caused by a transition-shift would occur. In this case (i.e. an error in the reproduced signal due to a transition-shift) no runlength is missing and therefore no substitution is allowed in order to correct the information signal.

Another device according to the invention is characterised in that the channel signal comprises control elements that exceed the predetermined value and that the predetermined value is larger than the length of control elements present in the channel signal. Another device according to the invention is characterised in that the control elements are synchronisation marks.

The channel signal usually comprises control elements, for example synchronisation marks. These synchronisation marks are intended to synchronise receiving the information of the channel signal when reading out the carrier. In order to be able to detect these control elements in a reliable manner and in order to be able to distinguish these control elements from the other, data containing, elements, these control elements have a runlength violating the k-constraint in a relatively large manner. E.g. a (2,8)-sequence comprises of synchronisation marks with a runlength of I11. This device therefore has as an advantage that a substitution of an element of the channel signal only occurs if a k-violation is present in the reproduced signal which exceeds a "violation" of this constraint due to the detection of a synchronisation mark. If a substitution would take place on a k-violation due to the detection of a synchronisation mark, an unjust substitution would occur, introducing additional errors.

Another device according to the invention is characterised in that the element substituted by the substitute means has a runlength according to the minimum runlength constraint.

Experiments have indicated that, when reading out a record carrier, the small runlengths have the largest probability of not being detected. This device therefore has as an advantage that a substitution of part of the information signal with an element with a minimum allowed runlength, e.g. in a d=2 constrained code this minimum allowed runlength is an I3 runlength, will have the largest probability that a correct substitution is carried out onto the information signal.

A method for reproducing a digital information signal from a channel signal, the digital information signal being runlength limited with one or more constraints, comprises the steps of receiving the channel signal, comparing a detected runlength with predetermined value indicative of a minimum runlength constraint or a maximum runlength constraint of the channel signal, generating a control signal when the detected runlength violates said constraint, and substituting an element of the channel signal in response to the control signal.

BRIEF DESCRIPTION OF THE DRAWINGS

These and other aspects of the invention will be further described in the figure description, in which.

DETAILED DESCRIPTION OF THE INVENTION

Figure 1:
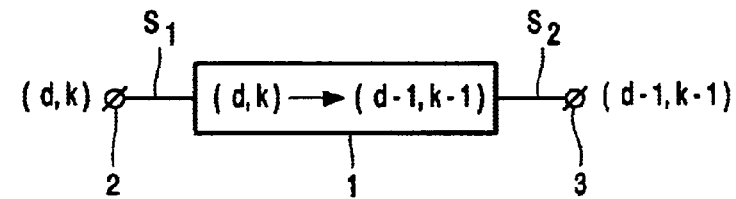
FIG. 1 shows an device for converting a (d,k) sequence into a (d−1,k−1) sequence.

FIG. 1 shows an device 1 that converts a (d,k) sequence into a (d−1,k−1) sequence by deleting a zero from the array of zeroes that occur each time between two consecutive ones in the (d,k) sequence. However, the invention is not limited to a (d−1,k−1) sequence. The invention can equally well be applied to a (2,8)-constrained code, being converted from a (1,7)-constrained code.

Information on runlength limited sequences can be found for example in U.S. Pat. No. 5,477,222 (PHN 14.448) or in §5.1 of Coding Techniques for Digital Recorders, K.A. Schouhamer Immink, Prentice Hall International, 1991, ISBN 0-13-140047-9.

A sequence $s_1$ is applied to the input 2 of the device. FIG. 1 shows the signal $s_1$, which has a d constraint equal to 2, this for the reason that the number of zeroes between the fourth and the fifth one in the sequence is 2. Upon conversion, the sequence $s_2$ has been obtained. It follows from FIG. 1 that the number of zeroes between consecutive ones in the sequence $s_2$ each time has been decreased by one. As a result, the signal $s_2$ is a (d−1,k−1) constrained sequence. The signal $s_2$, obtained with the device of FIG. 1 could, after having carried out a 1T precoding on the signal $s_2$, be recorded on a record carrier, such as an optical record carrier.

When viewed on a sufficiently long time scale, the two signals $s_1$ and $s_2$ will, of course, be substantially equally long. The difference lies in the fact that the bitrate for the signal $s_2$ is lower than for the signal $s_1$.

Figure 2:
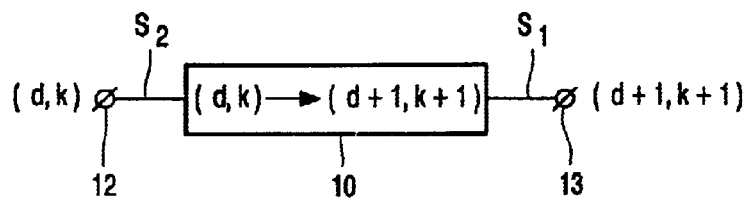
FIG. 2 shows an device for converting a (d,k) sequence into a (d+1,k+1) sequence.

FIG. 2 shows a device 10 that converts a (d,k) sequence into a (d+1,k+1) sequence by adding a zero to the array of zeroes that occur each time between two consecutive ones in the (d,k) sequence. A sequence $s_2$ is applied to the input 12 of the device. FIG. 2 shows the signal $s_2$, which has a d constraint equal to 1, this for the reason that the number of zeroes between the fourth and the fifth one in the sequence is 1. Upon conversion, the sequence $s_1$ has been obtained. It follows from FIG. 2 that the number of zeroes between consecutive ones in the sequence $s_1$ each time has been increased by one. As a result, the signal $s_1$ is a (d+1,k+1) constrained sequence, which has the same bitrate as the signal $s_1$ in FIG. 1, assuming that the signal $s_2$ in FIG. 2 is the same signal as the signal $s_2$ in FIG. 1.

Figure 3:
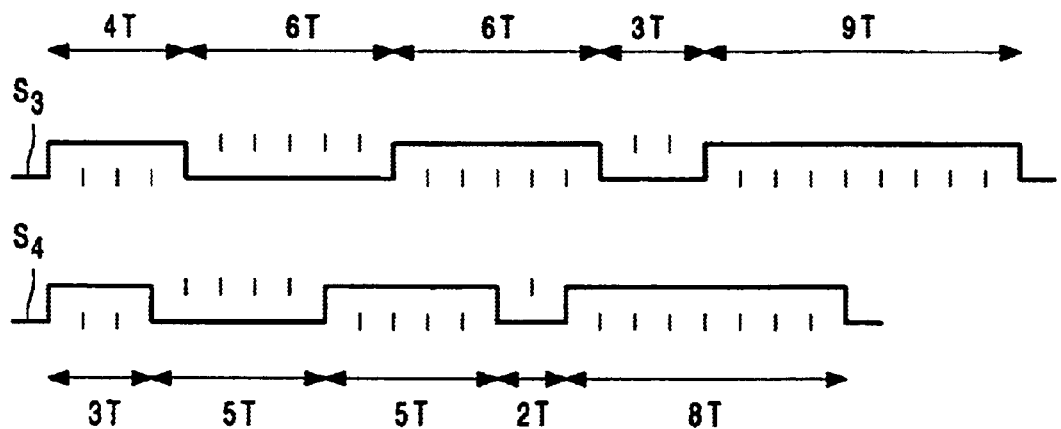
FIG. 3 shows the conversion of a RLL sequence of the type (d,k) into a RLL sequence of the type (d−1,k−1)

FIG. 3 shows a runlength limited signal $s_3$, with a minimum runlength of 3. An device, alike the device of FIG. 1, which is capable of changing the runlengths in the signal $s_3$ by subtracting one bitcell (or 1T) from each runlength occurring in the signal $s_3$, results in the signal $s_4$, also shown in FIG. 3. Conversely, an device, alike the device of FIG. 2, which is capable of changing the runlengths in the signal $s_4$, by adding one bitcell (or 1T) to each runlength occurring in the signal $s_4$, results in the signal $s_3$.

Here again, when viewed on a sufficiently long time scale, the two signals $s_3$ and $s_4$ will, of course, be substantially equally long. The difference lies in the fact that the bitrate for the signal $s_4$ is lower than for the signal $s_3$.

Figure 4:
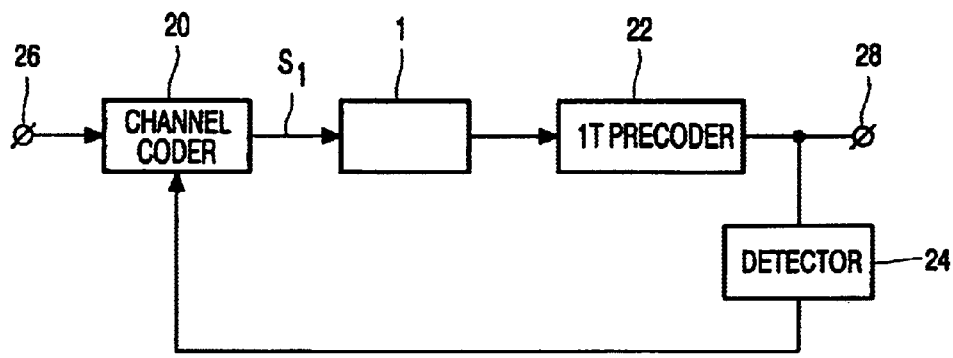
FIG. 4 shows an encoding device provided with a channel encoder for generating a (d,k) sequence.

FIG. 4 shows an embodiment of the encoding device, where the conversion unit 1 of FIG. 1 is used, together with a channel encoder 20, an a1T precoder, more specifically a 1T precoder 22 and a detector 24. A source signal is supplied to the input 26, which is converted into the (d,k) sequence $s_1$. The channel encoder 20 can be any channel encoder, such as the EFM+coder introduced earlier that channel encodes the input signal into the (d,k) sequence. After conversion in the converter unit 1, the converted signal is encoded in the 1T precoder, well known in the art, resulting in an output signal which is available at the output 28. The channel encoder encodes its input signal into the (d,k) sequence in response to a control signal supplied by the detector 24. The control signal may, as an example, lead to the output signal of the 1T precoder being DC free, or any other requirement to be imposed on the precoder output signal.

The channel coder 20 is preferably adapted to generate such a (d,k) sequence in response to the source signal, that the number of 'ones' per bit is substantially constant. In the earlier mentioned U.S. Pat. No. 5,477,222, single 2-bit source words were converted into single 3-bit converted words, or two subsequent 2-bit source words were converted into two subsequent 3-bit converted words, or three subsequent 2-bit source words were converted into three subsequent 3-bit converted words. One could imagine that the conversion of single 2-bit source words leads to converted words that include only one '1' bit, that the conversion of two subsequent 2-bit source words leads to two subsequent 3-bit converted words including two '1' bits and that the conversion of three subsequent 2-bit source words leads to three subsequent 3-bit converted words including three '1' bits. As a result, the output signal of the channel encoder 20 includes ⅓ '1' bits per bit.

A possible embodiment of a channel coder that is capable of realising a constant number of 'ones' per bit, is as follows. Let us assume that the d constraint equals 1 and that a 7/12-conversion code is aimed at. 233 channel words of length 12 exist that satisfy the d=1 constraint and start with at least one 'zero', so that they can be concatenated freely. Of those 233 channel words, 11 channel words comprise only one 'one', 45 channel words comprise two 'ones', 84 channel words comprise three 'ones', 70 channel words comprise four 'ones', 21 channel words comprise five 'ones' and one channel word comprises six 'ones'.

The channel coder can now be realised by allocating the 84 channel words comprising three 'ones' each to a corresponding one of 84 7-bit source words. Further, choose 45 pairs of channel words comprising two or four 'ones'. Allocate each pair to one of 45 7-bit source words. As the sum of 45 and 84 equals 129, which is larger than 128, it is possible to realise the 7/12-channel code. Encoding is now realised as follows. Encoding of the 84 source words into the 84 channel words comprising three 'ones' is straightforward. As soon as a source word appears that corresponds to a pair of channel words, alternately the channel word comprising two 'ones' and the channel word comprising four 'ones' is chosen. As a consequence, a channel code conversion is carried out resulting in a channel signal comprising one 'one' per three bits.

Figure 5:
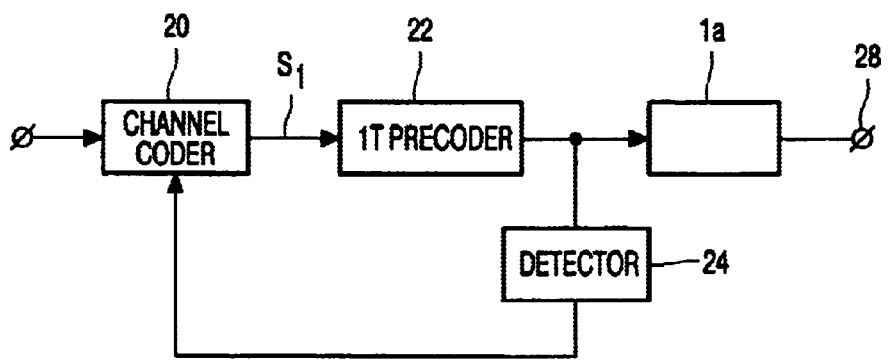
FIG. 5 shows an encoding devices provided with a channel encoder for generating a RLL sequence of the type (d,k)

FIG. 5 shows another embodiment of the encoding device, in which the conversion as explained with reference to FIG. 3 is employed. Apart from the encoding unit 1a, which changes the rnnlengths in the way described above with reference to FIG. 3, the embodiment comprises, again, a channel encoder 20, an aT precoder, more specifically a 1T precoder 22 and a detector 24. The converter 1a is now located at another position, namely at the output of the 1T precoder, so that the converter 1a can convert the RLL sequence generated by the 1T precoder 22.

A source signal is supplied to the input 26, which is converted into the (d,k) a sequence $s_1$. The channel encoder 20 can be any channel encoder, such as the EFM+coder introduced earlier that channel encodes the input signal into the (d,k) sequence. The (d,k) sequence is encoded in the 1T precoder, well known in the art, resulting in the RLL sequence at its output. The converter 1a subsequently converts the RLL sequence, in the way described above, into the output signal, which is available at the output 28. The channel encoder encodes its input signal into the (d,k) sequence in response to a control signal supplied by the detector 24. The control signal may, as an example, lead to the output signal of the 1T precoder being DC free, or any other requirement to be imposed on the precoder output signal.

The channel coder 20 is preferably adapted to generate such a (d,k) sequence in response to the source signal, that the number of signal transitions per bit in the RLL sequence at the output of the precoder 22 is substantially constant. This could be realised by using a channel coder 20 as described above.

Figure 6:
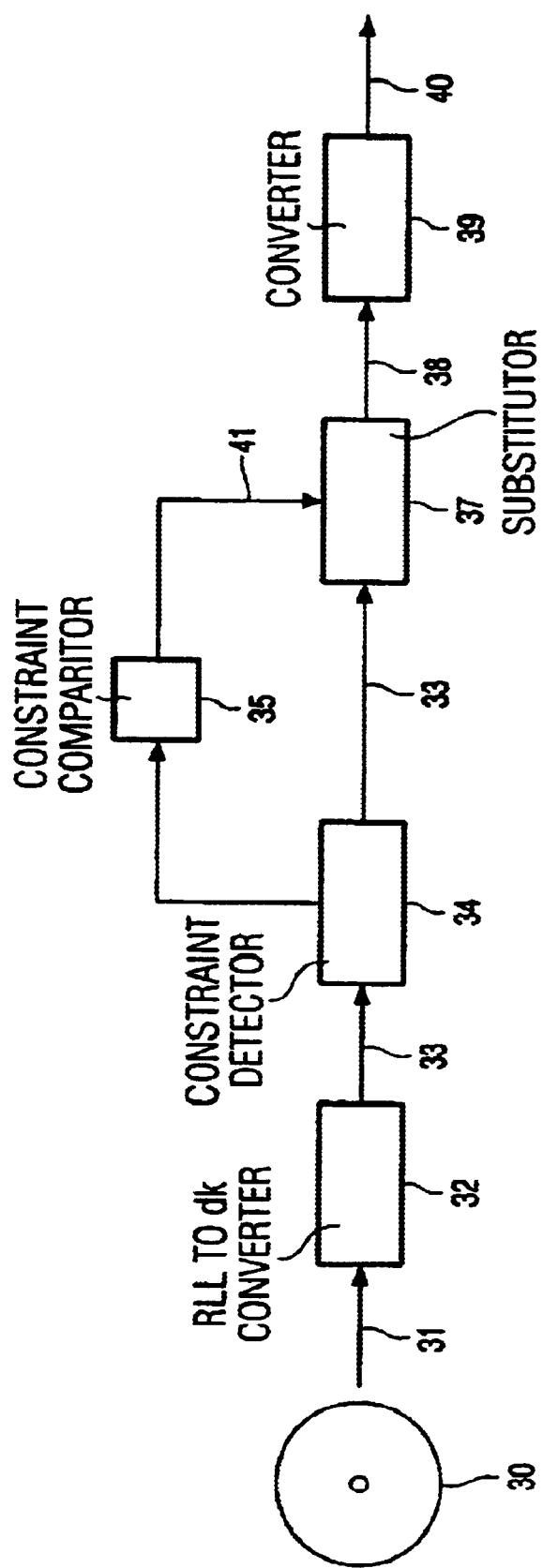
FIG. 6 shows an embodiment of the device for reproducing a digital information signal from a record carrier according to the invention.
Figure 7:
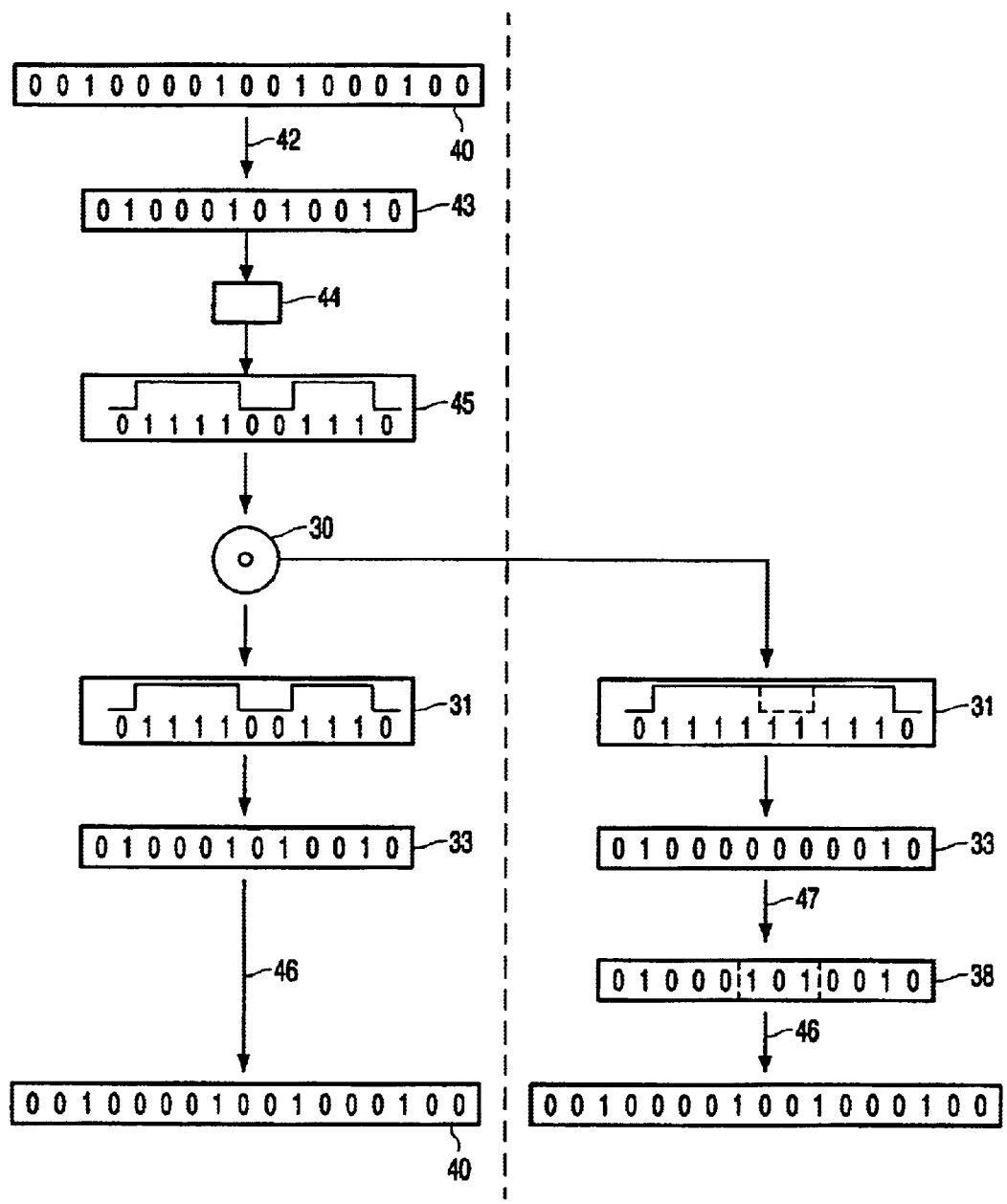
FIG. 7 shows an example of the functioning of the device of FIG. 6.

FIG. 6 shows an embodiment of the device for reproducing a digital information signal from a record carrier according to the invention. Functioning of this device is explained on the basis of the example shown in FIG. 7. In FIG. 7 a (d,k) sequence 40 is indicated. This sequence 40 is (d,k) constrained with d=2 and k=8. In step 42 this sequence 40 is converted into a (d−1,k−1)-constrained sequence 43. This conversion can be performed with the encoding device shown in FIG. 4. This conversion is further elucidated in FIG. 1. After preceding this sequence in the 1T-precoder 44 the precoded sequence 45 is stored on a record carrier 30. In FIG. 6 the stored sequence 31 is obtained by reading out the record carrier 30. In block 32 the sequence 31 in the RLL domain is converted into the sequence 33 in the (d,k) domain. In this example, this sequence 33 is (d−1,k−1)-constrained.

In the left part of FIG. 7 is indicated the situation in which the correct sequence is obtained from the record carrier. In the right part of FIG. 7 is indicated the situation in which an incorrect sequence is obtained from the record carrier.

The device shown in FIG. 6 also comprises constraint-detecting means 34 for detecting the runlength of an element of the sequence 33, comparator means 35 for comparing the runlength constaaint with a predetermined value and substitute means 37 for substituting part of the sequence 33. The constraint detecting means 34 sends the runlength to the comparator means 35. The comparator means 35 generates a control signal 41 if the detected runlength exceeds the predetermined value present in the comparator means and sends this control signal to substitute means 37 for substituting part of the sequence 33 in response to the occurrence of this control signal 41.

In case a correct sequence 33 is obtained from the record carrier 30 (indicated in the left part of FIG. 7), the comparator means 35 do not generate a control signal 41 and after passing the substitute means 37 the unchanged sequence 38 is converted into the original (d,k)-constrained sequence 40 in the converting device 39. In the left part of FIG. 7, this conversion is performed in step 46.

In case an incorrect sequence 33 is obtained from the record carrier 30 (indicated in the right part of FIG. 7), in particular in case short runlengths are not detected, the comparator means 35 generates a control signal 41 and in response to the occurrence of the control signal 41 an element of the sequence 33 is substituted in the substitute means. In FIG. 7, this substitution is performed in step 47. The corrected sequence 38 is converted into the original (d,k)-constrained sequence 40 in the converting device 39. In the right part of FIG. 7, this conversion is performed in step 46. After substituting an element of the sequence, it is possible that this element is not inserted into the sequence at exactly the right position, in other words, the substitution can cause a transition-shift. However, with the common Read-Solomon error-correction measures, like CIRC, known for example from U.S. Pat. No. 4,413,340 (PHQ 80.009), this transition-shift can be easily overcome.

Whilst the invention has been described with reference to preferred embodiments therefor, it is to be understood that these are not limitative examples. Thus, various modifications may become apparent to those skilled in the art, without departing from the scope of the invention, as defined by the claims.

It must be noted that the error-correction process as described in FIG. 6 and FIG. 7 is directed to (d,k)-constrained information signals. The device according to the invention however is not limited to this example as it is obvious that the device can also be applied to signals in the RLL domain (i.e. the error-correction process is performed before block 32 in FIG. 6). The device can also be applied to deconverted information signals (i.e. the error-correction process is performed after the converting device 39 in FIG. 6).

Further, the invention lies in each and every novel feature or combination of features.

What is claimed is:

1. A decoder, comprising:

means for receiving a channel signal;

means for comparing a detected runlength with a predetermined value indicative of a constraint selected from: the minimum runlength of the channel signal and the maximum runlength of the channel signal, and for generating a control signal when the detected runlength violates the constraint;

means for modifying the channel signal in response to the control signal, the modification selected from: deleting an element in the channel signal; and inserting an element into the channel signal; and means for converting the modified channel signal into a runlength limited information signal with a minimum runlength of d and a maximum runlength of k by changing the runlengths in the runlength limited information signal by n bitcells of the runlength limited information signal, where n is a constant value.

2. The decoder of claim 1, wherein the predetermined value is indicative of the maximum runlength constraint of the channel signal and wherein the control signal is generated when the detected runlength exceeds the predetermined value and wherein the modifying means insert an element into the channel signal in response to the control signal.

3. The decoder of claim 2, wherein the predetermined value is larger than the maximum runlength in the channel signal.

4. The decoder of claim 1, wherein the channel signal includes control elements that exceed the predetermined value and the predetermined value is larger than the length of control elements present in the channel signal.

5. The decoder of claim 4, wherein the control elements include synchronization marks.

6. The decoder of claim 1, wherein the element inserted or deleted by the modifying means has a runlength according to the minimum runlength constraint.

7. The decoder of claim 1, wherein d is 1 and k is 7.

8. The decoder of claim 1, wherein d is 2 and k is 8.

9. A player for a record carrier, comprising:

means for reading a channel signal from a track on the record carrier;

means for comparing a detected runlength with a predetermined value indicative of a constraint selected from: the minimum runlength of the channel signal and the maximum runlength of the channel signal, and for generating a control signal when the detected runlength violates the constraint;

means for modifying the channel signal in response to the control signal, the modification selected from: deleting an element in the channel signal, and inserting an element into the channel signal; and means for converting the modified channel signal into a runlength limited information signal with a minimum runlength of d and a maximum runlength of k by changing the runlengths in the runlength limited information signal by n bitcells of the runlength limited information signal, where n is a constant value.

10. The player of claim 9, wherein the predetermined value is indicative of the maximum runlength constraint of the channel signal and wherein the control signal is generated when the detected runlength exceeds the predetermined value and wherein the modifying means insert an element into the channel signal in response to the control signal.

11. The player of claim 10, wherein the predetermined value is larger than the maximum runlength in the channel signal.

12. The player of claim 9, wherein the channel signal includes control elements that exceed the predetermined value and the predetermined value is larger than the length of control elements present in the channel signal.

13. The player of claim 12, wherein the control elements includes synchronization marks.

14. The player of claim 9, wherein the element inserted or deleted by the modifying means has a runlength according to the minimum runlength constraint.

15. The player of claim 9, wherein d is 1 and k is 7.

16. The player of claim 9, wherein d is 2 and k is 8.

17. A method, comprising:

receiving a channel signal;

comparing a detected runlength with a predetermined value indicative of a constraint imposed on the channel signal, the constraint being selected from: the minimum runlength of the channel signal; and the maximum runlength of the channel signal;

generating a control signal when the detected runlength violates the constraint;

modifying the channel signal in response to the control signal, the modification being selected from: adding an element to the channel signal and deleting an element from the channel signal; and converting the channel signal information signal having a minimum runlength of d and a maximum runlength of k by changing the runlengths in the runlength limited information signal by n bitcells of the runlength limited information signal, where n is a constant value.

18. The method of claim 17, wherein the predetermined value is indicative of the maximum runlength constraint of the channel signal and wherein the control signal is generated when the detected runlength exceeds the predetermined value and wherein the modifying means insert an element into the channel signal in response to the control signal.

19. The method of claim 18, wherein the predetermined value is larger than the maximum runlength in the channel signal.

20. The method of claim 17, wherein the channel signal includes control elements that exceed the predetermined value and the predetermined value is larger than the length of control elements present in the channel signal.

21. The method of claim 20, wherein the control elements include synchronization marks.

22. The method of claim 17, wherein the element inserted or deleted by the modifying means has a runlength according to the minimum runlength constraint.

23. The method of claim 17, wherein d is 1 and k is 7.

24. The method of claim 17, wherein d is 2 and k is 8.

* * * * *